United States Patent
Kuwahara et al.

(10) Patent No.: US 10,192,749 B2
(45) Date of Patent: Jan. 29, 2019

(54) DRY-ETCHING METHOD

(71) Applicant: Hitachi High-Technologies Corporation, Tokyo (JP)

(72) Inventors: Kenichi Kuwahara, Tokyo (JP); Syuji Enokida, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/248,171

(22) Filed: Aug. 26, 2016

(65) Prior Publication Data

US 2017/0162397 A1 Jun. 8, 2017

(30) Foreign Application Priority Data

Dec. 4, 2015 (JP) ................................. 2015-237091

(51) Int. Cl.
| | |
|---|---|
| H01L 21/30 | (2006.01) |
| H01L 21/3065 | (2006.01) |
| H01L 21/308 | (2006.01) |
| H01L 29/78 | (2006.01) |
| H01L 21/311 | (2006.01) |
| H01L 21/3213 | (2006.01) |

(52) U.S. Cl.
CPC ........ *H01L 21/3065* (2013.01); *H01L 21/308* (2013.01); *H01L 21/31105* (2013.01); *H01L 21/31116* (2013.01); *H01L 21/32132* (2013.01); *H01L 21/32137* (2013.01); *H01L 29/785* (2013.01)

(58) Field of Classification Search
CPC . H01L 21/3065; H01L 29/785; H01L 21/308; H01L 21/32137; H01L 21/32132; H01L 21/31116; H01L 21/31105
See application file for complete search history.

(56) References Cited

U.S. PATENT DOCUMENTS

| | | | |
|---|---|---|---|
| 6,540,885 B1 * | 4/2003 | Keil | ................ H01L 21/31116 204/192.33 |
| 2005/0150863 A1 * | 7/2005 | Katsunuma | ....... H01L 21/31116 216/41 |
| 2006/0063385 A1 | 3/2006 | Maruyama et al. | |

(Continued)

FOREIGN PATENT DOCUMENTS

| | | |
|---|---|---|
| JP | 06-65214 B2 | 8/1994 |
| JP | 2003-234328 A | 8/2003 |
| JP | 2017-92376 A | 5/2017 |

OTHER PUBLICATIONS

Taiwanese Office Action received in corresponding Taiwanese Application No. 105126381 dated Mar. 13, 2017.

(Continued)

*Primary Examiner* — Duy Vu N Deo
*Assistant Examiner* — Mahmoud Dahimene
(74) *Attorney, Agent, or Firm* — Mattingly & Malur, PC

(57) ABSTRACT

According to the present invention, a dry-etching method for performing plasma etching in a vertical profile while maintaining selectivity relative to a mask, includes: a first process of etching a film to be etched with use of reactive gas to cause an etching profile of the film to be etched to be formed in a footing profile; and a second process of, after the first process, causing the footing profile to be formed in a vertical profile by means of sputtering etching.

7 Claims, 2 Drawing Sheets

(56) References Cited

U.S. PATENT DOCUMENTS

2017/0140923 A1    5/2017    Watanabe et al.

OTHER PUBLICATIONS

Taiwanese Office Action received in corresponding Taiwanese Application No. 105126381 dated Sep. 6, 2017.
Korean Office Action received in corresponding Korean Application No. 10-2016-0098401 dated Oct. 30, 2017.
Japanese Office Action received in corresponding Japanese Application No. 2015-237091 dated Oct. 30, 2018.

* cited by examiner

DRY-ETCHING METHOD

BACKGROUND OF THE INVENTION

The present invention relates to a method for manufacturing a semiconductor device and more specifically relates to a plasma etching technique for a material to be etched.

In recent years, to achieve high-integration and high-speed semiconductor devices, pattern size reduction using techniques such as self-aligned double patterning (SADP) and self-aligned quadruple patterning (SAQP) has progressed at an accelerated pace in a mask forming method. Also, a structure of a transistor is changing from a conventional planar type structure to a fin field effect transistor (Fin FET, hereinbelow referred to as a Fin FET) structure, which is a 3D structure and is a more complicated structure.

As a result, a higher-aspect-ratio device is developed as the device generation is advanced, and a higher-level etching technique has been required. Especially, in a process of etching a trench in silicon for forming a Fin FET gate and a process of etching a dummy gate interconnection in Poly-Si formed to straddle the Fin FET gate, it is difficult to achieve vertical etching due to the high-aspect-ratio structure.

Etchant causing a chemical reaction is difficult to go into a small space between patterns of the high-aspect-ratio structure, and etching is difficult to proceed. Thus, a tapered or footing profile appears, which causes a problem in which an etching stop occurs. To avoid the problem, etching conditions are adjusted to prevent etching from stopping by increasing the flow rate of process gas or adding a small amount of fluorine-containing gas or the like as gas causing a more highly-volatile reaction, for example.

However, since the amount of a reaction product is small as well in the small space, a sufficient sidewall protection film generated by adhesion of the reaction product cannot be formed. Thus, as the etching proceeds, a side-etching profile is generated at a part directly under a mask. As a measure for this problem, a method for inserting a step of oxygen plasma in the middle of the etching to repeat protection of the sidewall and etching is proposed as described in JP-H06-65214-B2, for example.

There is an alternative method, in which the output of RF bias to be applied to wafer is increased to strengthen an ion sputtering effect, accelerate progression of etching in the small space between patterns, increase the amount of the reaction product, and protect the sidewall.

SUMMARY OF THE INVENTION

However, the method in JP-H06-65214-B2 goes to a subsequent oxygen step in a state in which a footing profile at the corners of the bottom surface processed by the etching remains, and the etching surface is oxidized and solidified. Repeating this causes a problem in which the etching sidewall is formed in a stepped profile called a scallop profile.

Also, the method for increasing the output of the RF bias to form the sidewall protection film causes a problem in which selectivity relative to a mask is lowered due to the sputtering effect to easily cause mask faceting.

The present invention is accomplished by taking such problems as mentioned above into consideration thereof, and an object thereof is to provide a dry-etching method for performing plasma etching in a vertical profile while maintaining selectivity relative to a mask.

In order to solve the above issue, according to the present invention, a dry-etching method for performing plasma etching in a vertical profile while maintaining selectivity relative to a mask, includes: a first process of etching a film to be etched with use of reactive gas to cause an etching profile of the film to be etched to be formed in a footing profile; and a second process of, after the first process, causing the footing profile to be formed in a vertical profile by means of sputtering etching.

In addition, according to the present invention, a dry-etching method for performing plasma etching in a vertical profile while maintaining selectivity relative to a mask, includes: a first process of etching a film to be etched with use of reactive gas to cause an etching profile of the film to be etched to be formed in a footing profile; and a second process of, after the first process, sputter-etching the film to be etched that has been subjected to the first process with use of only inert gas.

According to the present invention, plasma etching can be performed in a vertical profile while maintaining selectivity relative to a mask.

BRIEF DESCRIPTION OF THE DRAWINGS

Other objects and advantages of the invention will become apparent from the following description of embodiments with reference to the accompanying drawings in which.

DESCRIPTION OF THE EMBODIMENTS

Hereinbelow, an embodiment of the present invention will be described with reference to the drawings. The present embodiment is carried out by using an electron cyclotron resonance (ECR) etching apparatus performing etching with use of conventional electron cyclotron resonance.

Figure 1A:
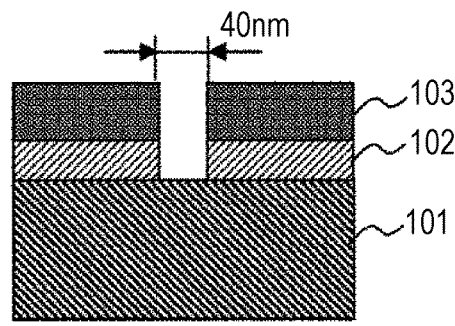
FIGS. 1A to 1D illustrate an etching flow in a dry-etching method according to the present invention.

FIG. 1A is a cross-sectional view of a semiconductor device according to the present embodiment. A thin $SiO_2$ film 102 is formed on a semiconductor silicon substrate 101, and an SiN film 103 is formed as a hard mask. On the $SiO_2$ film 102 and the SiN film 103, device patterns having an inter-pattern space width of 40 nm are transferred in advance by an appropriate process treatment, and a target etching depth is 200 nm.

As for conditions for a reactive ion assisted etching step serving as a first process, microwave power is 600 W, RF bias power is 40 W, mixed gas of 20 ml/min $Cl_2$ gas, 5 ml/min $O_2$ gas, and 60 ml/min HBr gas is used as etching gas, pressure in a treatment chamber is kept at 0.4 Pa, and a wafer temperature is maintained at 40° C.

Also, etching speed under these conditions was measured in advance, and it was confirmed that the etching speed was 1.0 nm/sec under these conditions. In the present embodiment, an etching treatment was performed for 20 seconds under these conditions to a depth of about 20 nm. As for an etching profile at this time, a footing profile is generated at the corners of the etching bottom surface as illustrated in FIG. 1B since the films are processed by means of the reactive ion assisted etching.

Subsequently, an ion sputtering etching step serving as a second process in which high-output RF bias was applied to inert gas plasma not causing a chemical reaction with a film to be etched was performed. As for conditions for this etching, microwave power is 600 W, RF bias power is 100 W, 100 ml/min Ar gas is used as inert gas, pressure in a treatment chamber is kept at 0.4 Pa, a wafer temperature is maintained at 40° C., and treatment time is 10 seconds, for example.

Figure 1B:
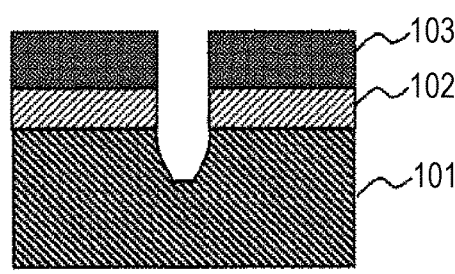
Figure 1C:
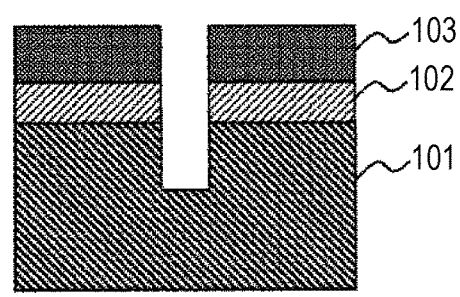

As a result of this ion sputtering etching step process, as illustrated in FIG. 1C, ion sputtering focuses on the corners of the etching bottom surface due to the ion sputtering step, and only the footing profiled part generated in FIG. 1B can selectively be etched and eliminated.

Figure 2:
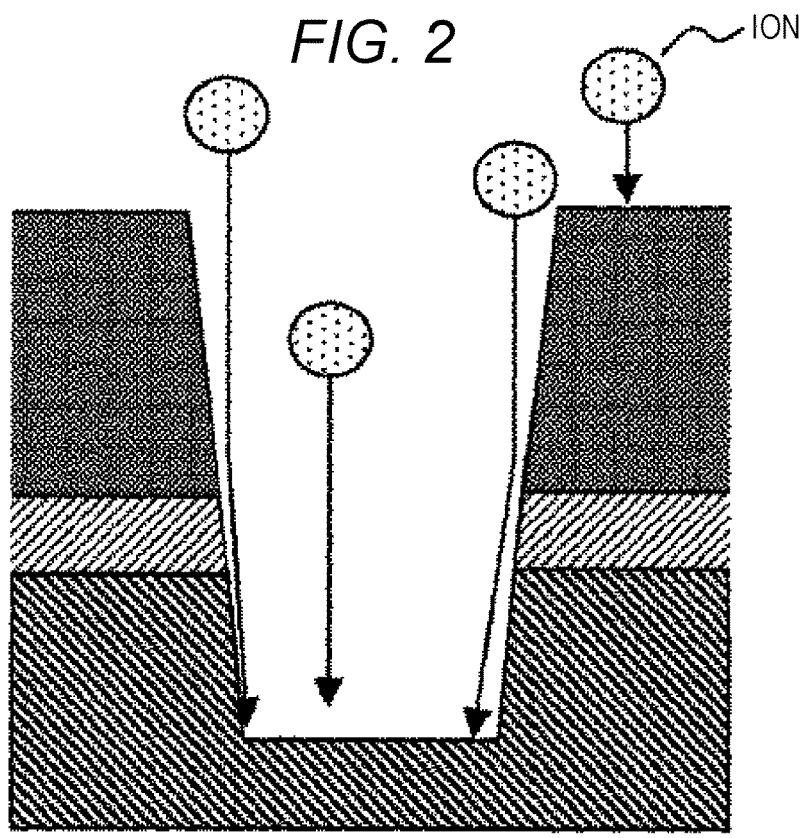
FIG. 2 is a principle diagram of ion etching in silicon etching.

The conceivable reason that the sputtering focuses on the corners of the etching bottom surface is that ions are guided to the etching bottom surface with use of the sidewall of the silicon substrate 101 as a guide to cause energy of the ion sputtering to focus on the corners of the pattern sidewall bottom surface as illustrated in FIG. 2. It is conceivable that, due to this phenomenon, an ion sputtering effect focuses on the footing profile formed at the corners of the bottom surface, high energy is collected in the corners, etching locally proceeds, and only the footing profile is eliminated while the entire depth is kept unchanged.

Also, the sputtering etching to the footing part requires high ion sputtering energy since the inert gas plasma is used, and since etching by means of a chemical reaction is not performed. Setting of the RF bias in the ion sputtering step is determined based on the following reasons.

In general, to eliminate the footing profile by means of the reactive ion assisted etching, a method for increasing the output of the RF bias to improve the ion sputtering effect is conceived. However, in this case, since the etching is performed by means of a chemical reaction, a problem in which selectivity relative to the mask is lowered and a problem in which the sidewall is in a tapered profile due to a reaction product generated by the chemical reaction occur.

Conversely, in the present invention, since ion sputtering is performed with use of inert gas, not reactive gas, the problem of lowering of selectivity relative to the mask and the problem caused by the reaction product are difficult to occur. Accordingly, higher RF bias than that in the reactive ion sputtering etching step can be applied. That is, it is conceived that, since higher RF bias can be applied in the ion sputtering etching step than that in the reactive ion assisted etching step serving as the first process, the footing profile can be eliminated efficiently.

Figure 1D:
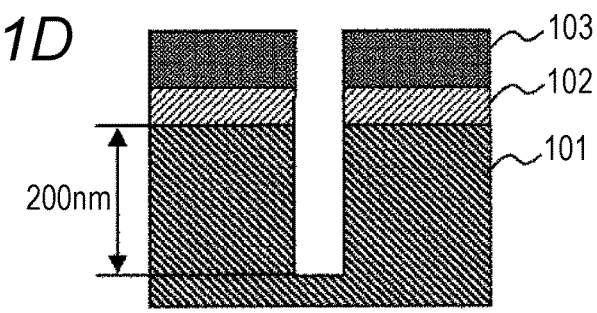

Subsequently, by repeating the reactive ion assisted etching step in FIG. 1B and the ion sputtering etching step by means of plasma using only the inert gas in FIG. 1C ten times in total, the etching treatment to a depth of 200 nm, which was a target depth, was performed as illustrated in FIG. 1D. In this manner, it was possible to perform etching while eliminating the footing profile per cycle, and vertical etching having no footing profile in the final profile was achieved.

Figure 3:
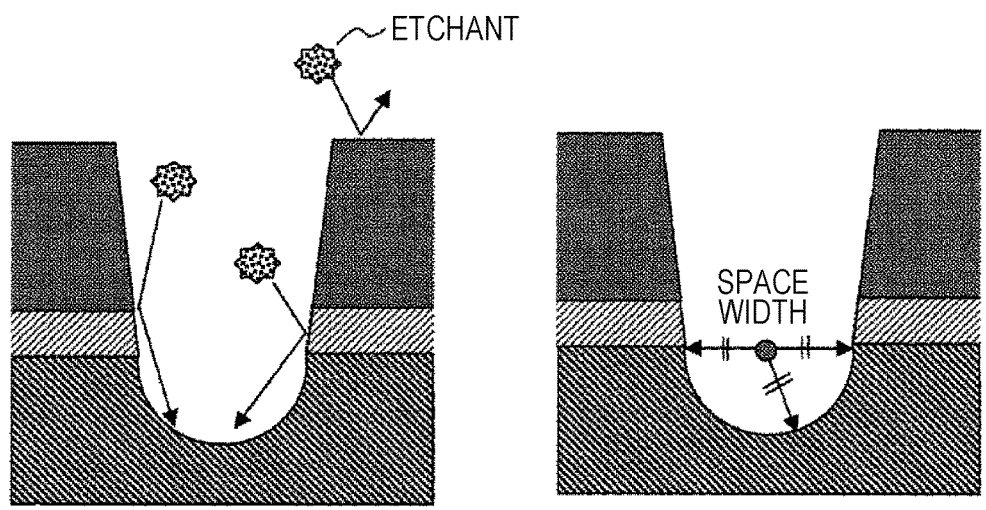
FIG. 3 is a principle diagram of chemical etching in the silicon etching.

As for timing of the ion sputtering etching step according to the present invention, the ion sputtering etching step needs to be performed at a stage at which the footing profile formed in the reactive ion assisted etching step is small. Normally, the footing profile is generated as etching proceeds in an isotropic manner due to a chemical reaction. Thus, in a case of a pattern illustrated in FIG. 3, the pattern sidewall acts as a guide when etchant reaches the etching surface, and the etchant is thus headed to some extent in the same direction.

Also, since the etchant reaches the bottom surface while being reflected on the sidewall, the reaching probability on the bottom surface is high at the center portion, selective etching at the center portion of the bottom surface proceeds inevitably, and a semi-circular profile with a space width serving as a diameter is formed. Thus, the etching amount required for the footing profile to be the maximum is the amount obtained when the etching is performed to a depth which is half of an inter-pattern dimension. That is, etching time until the footing profile is the maximum is derived from Equation (1) shown below.

$$T = (W/2)/S \tag{1},$$

where
T=etching time (second),
W=inter-pattern space width (nm), and
S=etching speed (nm/sec).

In the present embodiment, since the inter-pattern space width was 40 nm, and the etching speed was 1.0 nm/sec, treatment time for the reactive ion assisted etching step was set to 20 seconds based on Equation (1). Accordingly, to eliminate the footing profile more efficiently, the ion assisted etching step needs to be performed for treatment time derived by Equation (1), or less. In other words, treatment time for the reactive ion assisted etching step should be treatment time derived by Equation (1), or less.

According to the present invention, time until etching is performed to a depth which is half of the inter-pattern space width is calculated from etching speed of the reactive ion assisted etching step, the ion sputtering etching is performed under ion sputtering etching conditions in which higher RF bias than that in the reactive ion assisted etching step is applied with use of plasma using only inert gas each time after the reactive ion assisted etching is performed for the calculated time, and the reactive ion assisted etching step and the ion sputtering etching step are repeated until etching is performed to a predetermined etching amount. By doing so, vertical etching process with high selectivity relative to the mask and with no footing profile can be achieved.

Meanwhile, in the present invention, to obtain the vertical profile while maintaining the selectivity relative to the mask, the reactive ion assisted etching step and the ion sputtering etching step are not necessarily repeated. That is, in the present invention, by performing the reactive ion assisted etching step and the ion sputtering etching step at least once, respectively, the vertical profile can be obtained while maintaining the selectivity relative to the mask.

In the present embodiment, the etching time was calculated from the depth required for the footing profile to be the maximum under the reactive ion assisted etching conditions. However, in a case in which the treatment in FIG. 1C is performed for the time to reach the maximum depth, or less, verticalization by means of ion sputtering can be performed at a stage of a smaller footing profile, and the effect of the verticalization is thus enhanced.

In the present embodiment, although 100-W RF bias was used in the plasma treatment using inert gas, a similar effect to that in the present embodiment can be obtained as long as higher RF bias than that in the reactive ion assisted etching step is applied in the ion sputtering etching step using inert gas.

Also, the etching conditions in the present embodiment are illustrative only for etching the silicon substrate 101. Etching conditions according to the present invention are not limited to the etching conditions in the present embodiment.

Further, in the present embodiment, etching of the silicon substrate is raised as an example. However, a similar effect to that in the present embodiment can be obtained in a process of etching polysilicon used for a dummy gate, a process of etching another material containing a silicon element, and a process of etching a material containing a material containing a silicon element such as SiGe, amorphous silicon, WSi, SiO$_2$, SiN, SiC, and SiOC.

Still further, in the present embodiment, in the treatment in FIG. 1C, the Ar gas is used as the inert gas. However, instead, He gas, Ne gas, Kr gas, Xe gas, N$_2$ gas, or mixed gas into which two or more kinds out of these are mixed may be used. Still further, in the present embodiment, the hard mask of the SiN film is used as the mask for the silicon substrate. However, the present invention can also be applied when an SiO$_2$ film, a resist mask, or another mask structure is used.

Still further, in the present embodiment, microwave ECR plasma is used as a plasma source. However, the present invention can also be applied to etching using a plasma source such as inductively-coupled plasma, capacitively-coupled plasma, and helicon wave plasma.

The invention claimed is:

1. A dry-etching method for performing plasma etching of a film, deposited on a sample mounted on a sample stage, to a prescribed depth using a mask, comprising:
    a first process of etching the film using a reactive gas to cause an etching profile of the film to a depth to be formed in a footing profile at a pressure while supplying a first radio frequency power to the sample stage, the footing profile having corner portions formed along a sidewall portion of the film; and
    a second process of, after the first process, sputtering etching the film, that has been subjected to the first process, using only an Ar gas while supplying a second radio frequency power, higher than the first radio frequency power, to the sample stage to remove the corner portions of the footing profile to form a vertical profile by selectively removing the corner portions relative to the mask by using only the Ar gas without any reactive gas at the higher second radio frequency power,
    wherein the first process and the second process are repeated until the prescribed depth is reached, where the first process determines a new depth until the prescribed depth is reached and the second process changes the footing profile into the vertical profile after each time the new depth is determined by the first process.

2. The dry-etching method according to claim 1, wherein the film to be etched is a film containing Si.

3. The dry-etching method according to claim 1, wherein a structure of the film to be etched is a high-aspect-ratio structure.

4. A dry-etching method for performing plasma etching of a film, deposited on a sample mounted on a sample stage, to a prescribed depth using a mask having a predetermined inter-pattern space width, comprising:
    a first process of etching the film using a reactive gas to cause an etching profile of the film to be formed in a footing profile while supplying a first radio frequency power to the sample stage; and
    a second process of, after the first process, sputter-etching the film that has been subjected to the first process using only an Ar gas while supplying a second radio frequency power, higher than the first radio frequency power, to the sample stage to remove the corner portions of the footing profile to form a vertical profile by selectively removing the corner portions relative to the mask by using only the Ar gas without any reactive gas at the higher second radio frequency power,
    wherein the first process and the second process are repeated until the prescribed depth is reached, where the first process determines a new depth until the prescribed depth is reached and the second process changes the footing profile into the vertical profile after each time the new depth is determined by the first process, and
    wherein a time of the first process is less than or equal to a value derived by dividing a half value of the inter-pattern space width of the mask by a predetermined etching speed of the reactive gas in the first process.

5. The dry-etching method according to claim 4, wherein the film to be etched is a film containing Si.

6. The dry-etching method according to claim 4, wherein a structure of the film to be etched is a high-aspect-ratio structure.

7. The dry-etching method according to claim 4, wherein the second radio-frequency power supplied to the sample stage in the second process is higher than the first radio-frequency power supplied to the sample stage in the first process.

* * * * *